United States Patent [19]

Yoshida et al.

[11] Patent Number: 5,141,885
[45] Date of Patent: Aug. 25, 1992

[54] METHOD OF FABRICATION OF THIN FILM TRANSISTORS

[75] Inventors: Akihisa Yoshida, Hyogo; Masatoshi Kitagawa; Takashi Hirao, both of Osaka, all of Japan

[73] Assignee: Matsushita Electric Industrial Co., Ltd., Osaka, Japan

[21] Appl. No.: 709,495

[22] Filed: Jun. 3, 1991

[30] Foreign Application Priority Data

Jun. 5, 1990 [JP] Japan .................................. 2-148250

[51] Int. Cl.[5] ........................................ H01L 21/223
[52] U.S. Cl. ................................... 437/41; 437/37; 437/101
[58] Field of Search ............... 437/101, 40, 41, 21, 437/24, 37; 357/23.7, 2, 4

[56] References Cited

U.S. PATENT DOCUMENTS

| 4,169,740 | 10/1979 | Kalbitzer et al. ............... 148/15 |
| 4,859,908 | 8/1989 | Yoshida et al. .............. 204/298.37 |
| 4,998,152 | 3/1991 | Batey et al. ..................... 357/23.7 |

OTHER PUBLICATIONS

M. J. Powell, "Amorphous-Silicon Thin-Film Transistors: Performance and Material Properties", Proceedings of the SID, Vol. 26/3, 1985, pp. 191-196.

H. F. Bare and G. W. Neudeck, "Ion Implanted Contacts to a-Si:H Thin-Film Transistors", IEEE Electron Device Letters, vol. EDL-7, No. 7, Jul. 1986, pp. 431-433.

*Primary Examiner*—Mary Wilczewski
*Attorney, Agent, or Firm*—Ratner & Prestia

[57] ABSTRACT

A method of fabricating a thin film transistor on an insulating substrate such as quartz or glass without defect in the channel region in semiconductor thin layer, or at the boundary between the semiconductor thin layer and gate insulation layer, but with high mobility and high integration. For that purpose, ions produced by the discharge-decomposition of a hydride gas including dopant are accelerated and implanted into the semiconductor thin layer, wherein the protecting insulation layer for protection of the channel region is of a thickness larger than the projected range of the hydrogen ion.

5 Claims, 8 Drawing Sheets

METHOD OF FABRICATION OF THIN FILM TRANSISTORS

FIELD OF THE INVENTION

This invention relates to a method of fabricating a semiconductor device, especially a thin film transistor used in a liquid crystal display, image scanner, etc.

BACKGROUND OF THE INVENTION

Figure 6A:
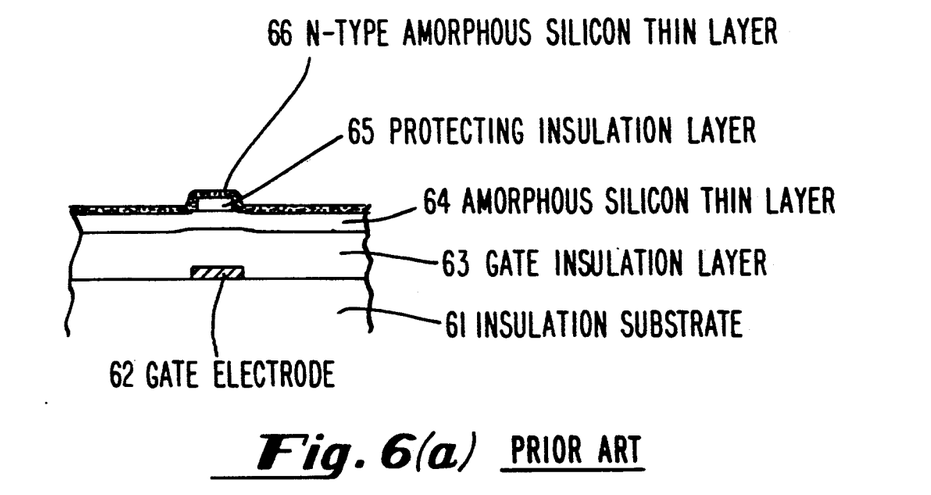
FIG. 6(a) is a fragmentary sectional view showing a conventional method of fabricating a thin film transistor.
Figure 6B:
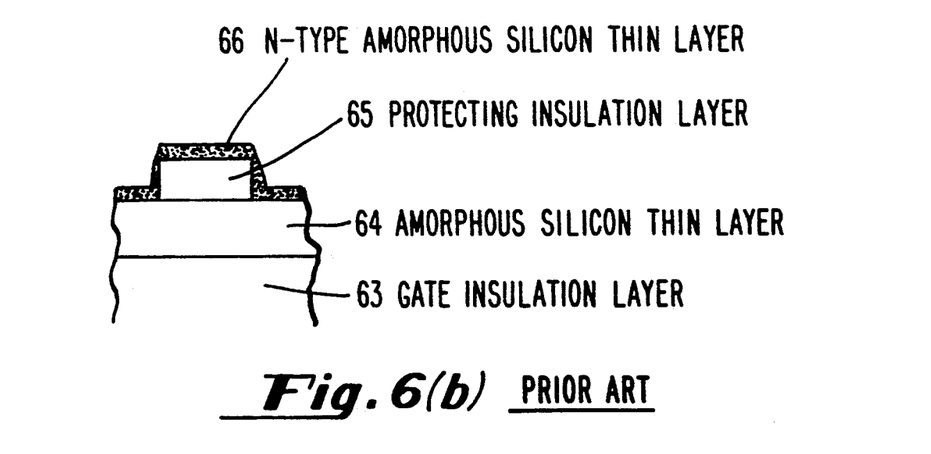
FIG. 6(b) is an enlarged partial view of the view of FIG. 6(a).
Figure 7A:
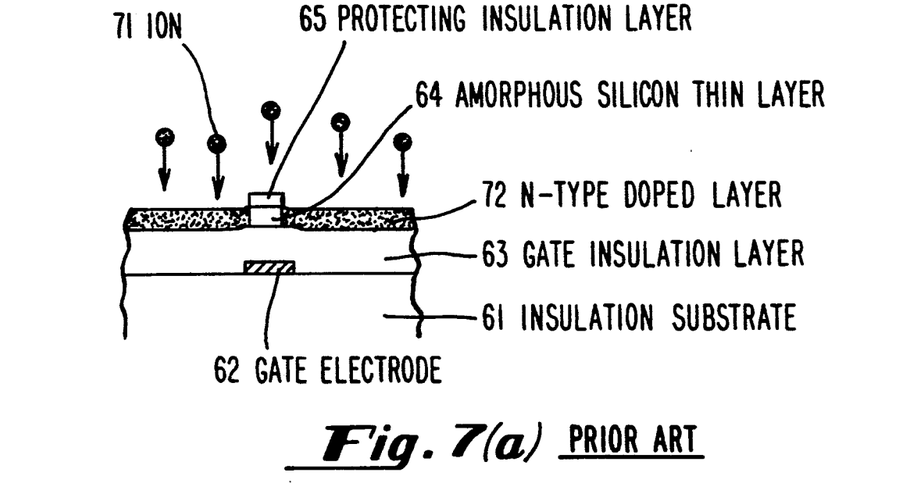
Figure 7B:
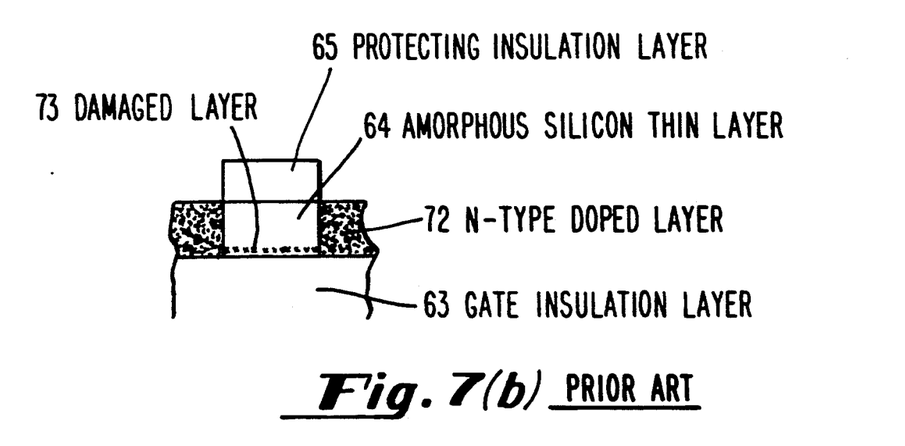
FIG. 7(b) is an enlarged partial view of the view of FIG. 7(a).

A conventional method of fabricating thin film transistors is shown in FIG. 6 and FIG. 7. In these figures, numeral 61 is an insulating substrate of quartz or glass, numeral 62 is a gate electrode, numeral 63 is a gate insulation layer consisting of nitride, numeral 64 is an amorphous silicon thin layer, numeral 65 is a protecting insulation layer of silicon nitride, numeral 66 is a thin layer of n type amorphous silicon. Numeral 71 is an ion including phosphorous and hydrogen, numeral 72 is an n-type doped layer, and numeral 73 is a damaged layer. Three conventional methods for the fabrication of thin film transistors are known: (1) deposition of an n-type amorphous silicon thin layer 66 on top of the amorphous silicon thin layer 64, by plasma CVD, as shown in FIG. 6, (2) forming an n-type doped layer 72, to discharge-decompose a gas including dopant, e.g., phosphine in hydrogen, and to accelerate, irradiate, and implant the produced ion 71 (A. Yoshida et al; U.S. Pat. No. 4,859,908) as shown in FIG. 7, and (3) forming an n-type doping layer by ion implantation with mass separation (H. F. Bare and G. W. Neudeck; IEEE Electron Device Letters EDL-7 (1986), 431.

Method (1) relating to the deposition of an n-type amorphous silicon thin layer by plasma CVD, however, had the disadvantage of necessitating a process to remove n-type amorphous silicon thin layer 66 on the protecting insulation layer 65, and the etching of the n-type amorphous silicon thin layer 66, thus resulting in yield decrease or reliability fall.

Referring to method (3), wherein an n-type doped layer is formed by ion implantation with mass separation, the process to remove an n-type amorphous silicon thin layer on the protecting insulation layer is not necessary, and the doping layer does not etch. This is because the n-type doping layer is formed in the amorphous silicon thin layer. However, because of the irradiation of the ion beam with mass separation, for the formation of a functional element for a large area such as the liquid crystal display, scanning of the sample and the ion beam is necessary, and the productivity is low.

Figure 8:
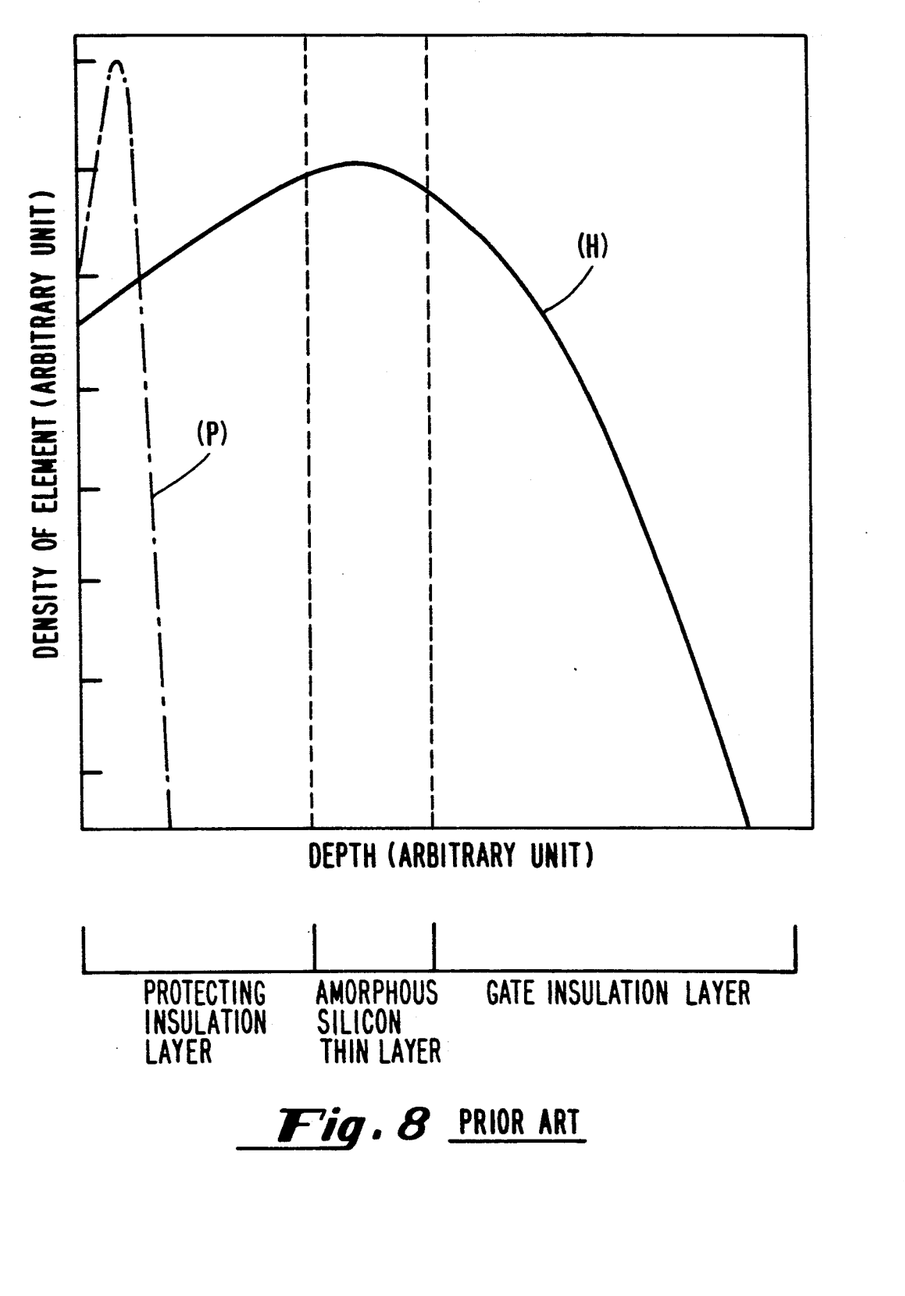
FIG. 8 shows the concentration distribution of hydrogen and phosphorous atoms along the depth in the doped region formed by a conventional method of fabricating thin film transistors.

By contrast, in method (2) above, in which ions are produced by the discharge-decomposition of a gas including dopant, and in which the ions are accelerated and irradiated and implanted to form the source and drain region, the processing of a large area article can be achieved with low cost and high productivity. However, since the produced ions are all implanted without mass separation into the substrate, light ions, especially of hydrogen which have long projected range (mean depth of implanted ions), reach the vicinity of the boundary of gate insulation layer 63 and amorphous silicon thin layer 64, and, as shown in FIG. 7(b), a damaged layer 73 is formed resulting in deterioration of characteristics, mobility and reliability of the thin film transistor. FIG. 8 shows the density distribution of hydrogen and phosphorous in the doped layer along the depth formed by the method (2) of fabricating a thin film transistor.

BRIEF DESCRIPTION OF THE INVENTION

It is an object of the present invention to provide a method of easily doping an article of large area, and to obtain a thin film transistor with high mobility and high integration, without any defect in the channel region of the semiconductor thin film.

In order to attain the above object, a method is disclosed for fabricating a thin film transistor to form the source and drain regions of the transistor comprising a gate electrode, gate insulation layer, semiconductor thin layer, protecting insulation layer, and output electrode. This is achieved by accelerating, irradiating, and implanting the ions obtained by the discharge-decomposition of a hydride gas including a dopant, according to the invention, thus making the thickness of the protecting insulation layer thicker than the projected range of hydrogen ions in the protecting insulation layer under the same accelerating condition. Alternatively, the ions may be implanted within a photoresist layer on the protecting insulation layer. If the protecting insulation layer is not available, ions may be implanted within the photoresist layer, not removed, and having a thickness larger than the projected range of hydrogen ions in the photoresist under the same condition.

BRIEF EXPLANATION OF THE DRAWINGS

FIG. 79a) is a fragmentary sectional view showing another conventional method of fabricating a thin film transistor.

DETAILED DESCRIPTION

Figure 1:
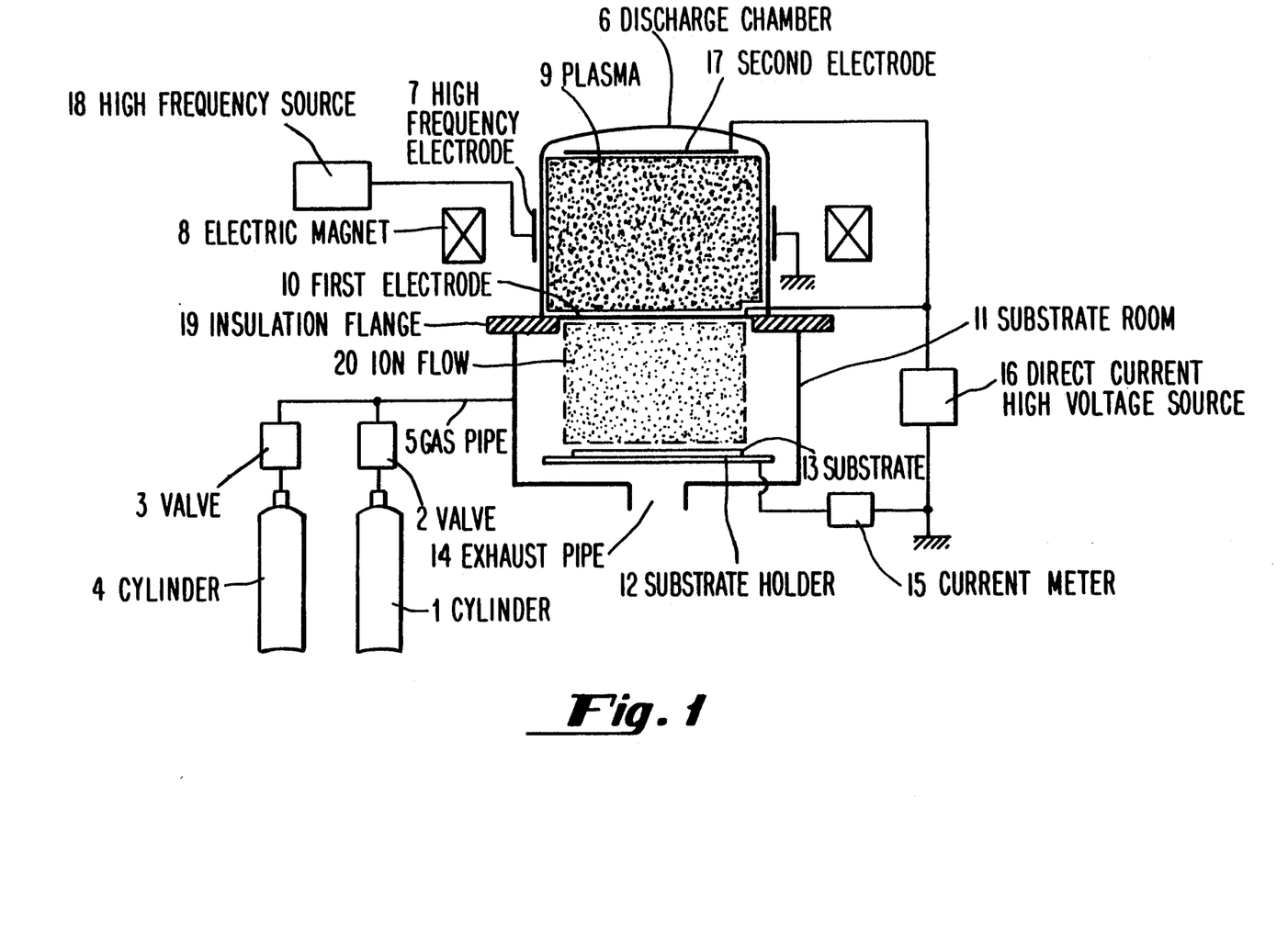
FIG. 1 is a diagram showing the general structure of the plasma processing equipment for large area ion irradiation, with which to apply the fabrication method of the thin film transistor, according to a first embodiment of the invention.

In the following description, embodiments of the invention are explained referring to FIG. 1, FIG. 2, FIG. 3, FIG. 4 and FIG. 5. Referring first to FIG. 1, doping hydride gas such as phosphine ($PH_3$) in cylinder 1 flowing out through valve 2 and diluting gas such as hydrogen ($H_2$) or helium (He) in cylinder 4 flowing out through valve 3 are mixed. The mixed gas is introduced through pipe 5 to the discharge chamber 6. The mixed gas is decomposed by the discharge of high frequency (13.56 MHz) electric power supplied by the high frequency electrode 7 to the discharge chamber 6, and an electric magnet 8. The ions in the highly excited plasma, thus produced, are accelerated by the direct voltage of the first electrode 10, and implanted into the substrate 13 of the semiconductor on the substrate holder 12 in the substrate room 11 to dope substrate 13. In this case, the ions implanted most deeply into the substrate, among the ions implanted into the substrate 13, are the hydrogen ions, as shown in FIG. 8. Doping the impurity into 9 pieces of a silicon wafer of 3 inch diameter simultaneously by using, for example, a plasma system (which has the substrate holder 12 with a diameter of 32 cm) achieves the possible uniform doping or plasma processing for a large area article, thus obtaining the fluctuation of doping within $\pm 3\%$ measured with sheet resistance. In the figure, numeral 14 is a gas exhaust pipe, 15 is an electric current meter, 16 is a direct current high voltage source, 17 is the second electrode, 18 is the high frequency source, 19 is the insulation flange, and 20 is the ion current.

Figure 2A:
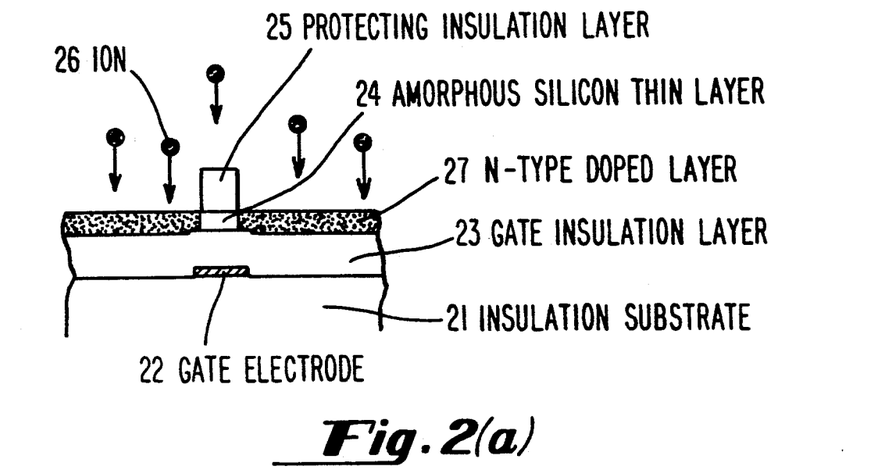
FIG. 2(a) is a fragmentary sectional view showing a method of fabricating a thin film transistor in accordance with a first embodiment of the invention using the plasma processing equipment of FIG. 1.
Figure 2B:
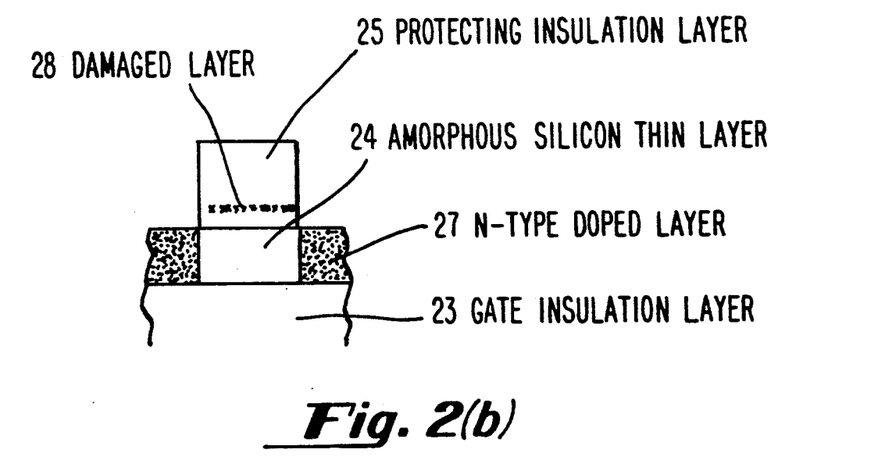
FIG. 2(b) is an enlarged fragmentary view of the part shown in FIG. 2(a).

FIG. 2(a) is a fragmentary sectional view showing the method of fabricating a thin film transistor in accordance with an embodiment of the invention using the plasma processing equipment of FIG. 1. FIG. 2(b) is an enlarged fragmentary view of the part shown in FIG. 2(a).

Referring to FIG. 2(a) and (b), the gate insulation layer 23, amorphous silicon thin layer 24, and protecting insulation layer 25 of insulator such as silicon nitride is deposited in order, by way of plasma CVD, onto the gate electrode 22 formed with necessary patterning on an insulation substrate of glass. The thickness of the protecting insulation layer 25 is set for a value sufficiently larger than the projected range of hydrogen ions to be implanted later. Through the protecting insulation layer 25 patterned by photolithography as a mask, and using the plasma equipment of FIG. 1, ions 26 including phosphorous and hydrogen ion 26′ are implanted into the amorphous silicon thin layer 24, to dope and to form an n-type doped layer 27.

At this time, the damaged layer 28 produced by the hydrogen ions 26′ are confined within the protecting insulation layer 25, and does not reach the amorphous silicon thin layer 24.

Figure 3A:
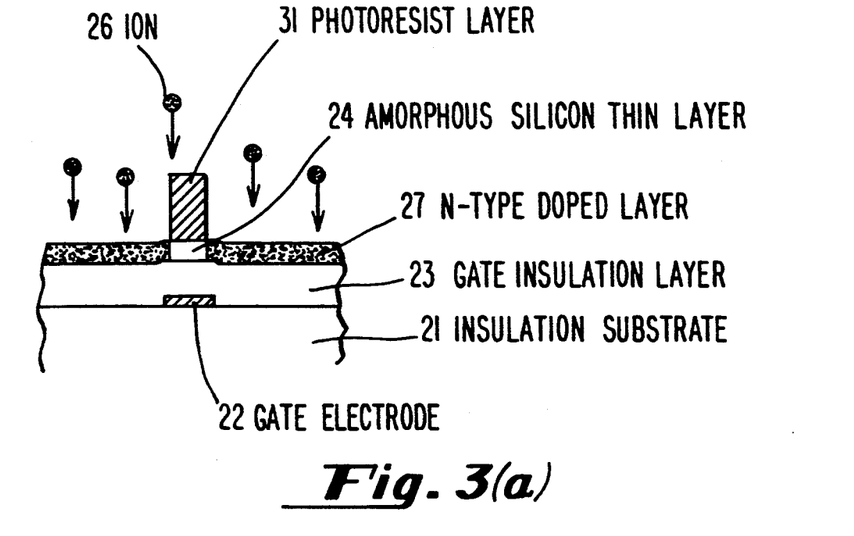
FIG. 3(a) is a fragmentary sectional view showing a method according to fabricating a thin film transistor of a second embodiment of the invention using the plasma processing equipment of FIG. 1.
Figure 3B:
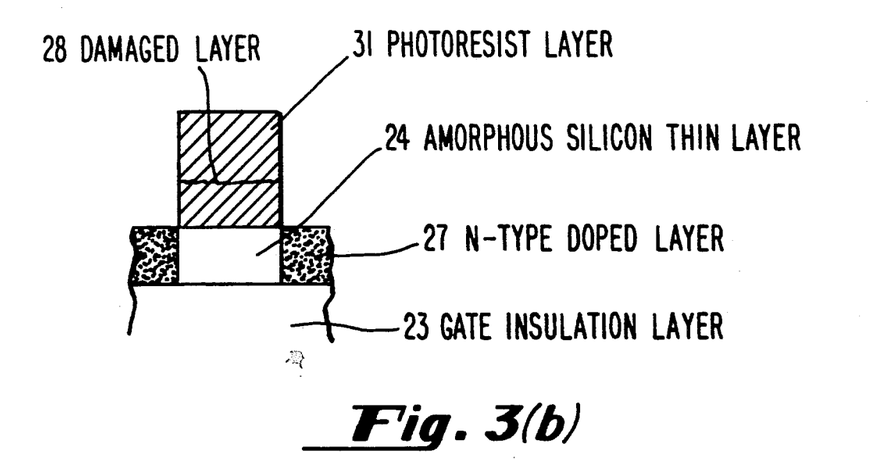
FIG. 3(b) is an enlarged sectional view of the view shown in FIG. 3(a).

FIG. 3(a) is a fragmentary sectional view showing a method of fabricating the thin film transistor according to the second embodiment of the invention using the plasma processing equipment of FIG. 1. FIG. 3(b) is an enlarged sectional view of the view shown in FIG. 3(a).

Referring to FIG. 3, parts which are also shown in FIG. 2 are numbered with the numbers used in FIG. 2. A feature of the second embodiment is the use of a photoresist layer 31 as a protecting insulation layer. In this case, too, the photoresist layer 31 is set to be thicker than the projected range of hydrogen ion, so that, the damaged layer 28 produced by the hydrogen ions 26′ are confined within the photoresist layer 31, and does not reach the amorphous silicon thin layer 24.

Figure 4A:
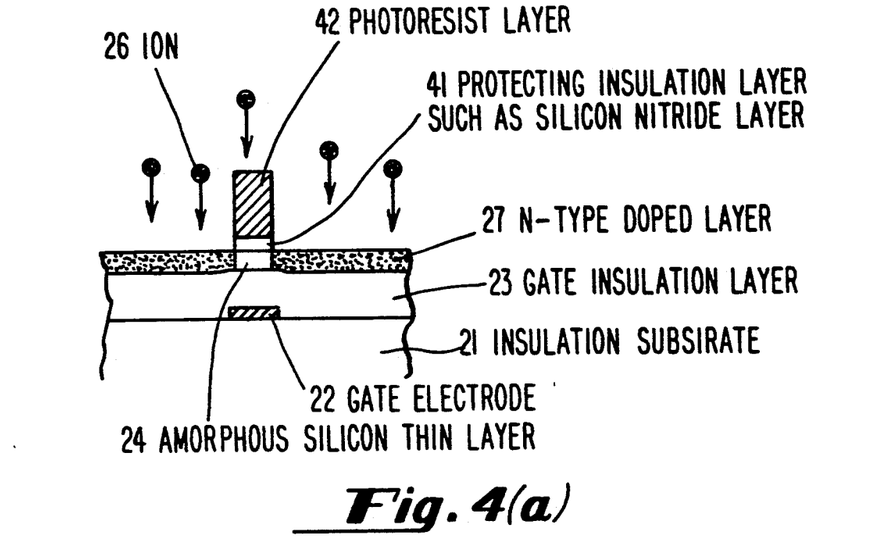
FIG. 4(a) is a fragmentary sectional view showing the fabrication method of the thin film transistor of the third embodiment of the invention using the plasma processing equipment of FIG. 2.
Figure 4B:
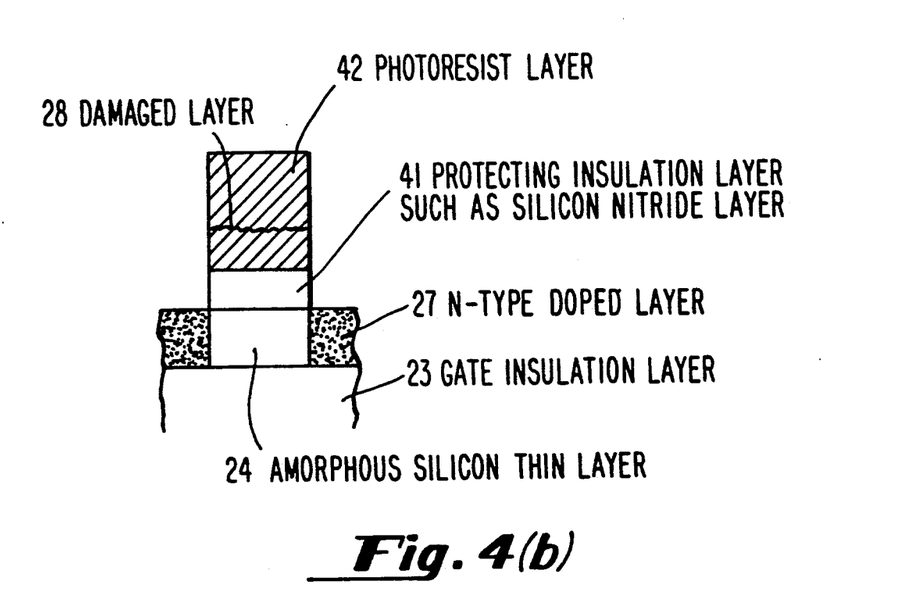
FIG. 4(b) is an enlarged sectional view of the view shown in FIG. 4(a).

FIG. 4(a) is a fragmentary sectional view showing the fabrication method of the thin film transistor of the third embodiment of the invention using the plasma processing equipment of FIG. 1, and FIG. 4(b) is an enlarged sectional view of the view shown in FIG. 4(a).

Referring to FIG. 4, parts which are also shown in FIG. 2 are numbered with the numbers used in FIG. 2. A feature of the third embodiment is the use of a deposited layer consisting of a protecting insulation layer 41 of insulator such as silicon nitride and a photoresist layer 42.

As in the case of the first and second embodiments, the damaged layer 28 does not reach the amorphous silicon thin layer 24.

Figure 5:
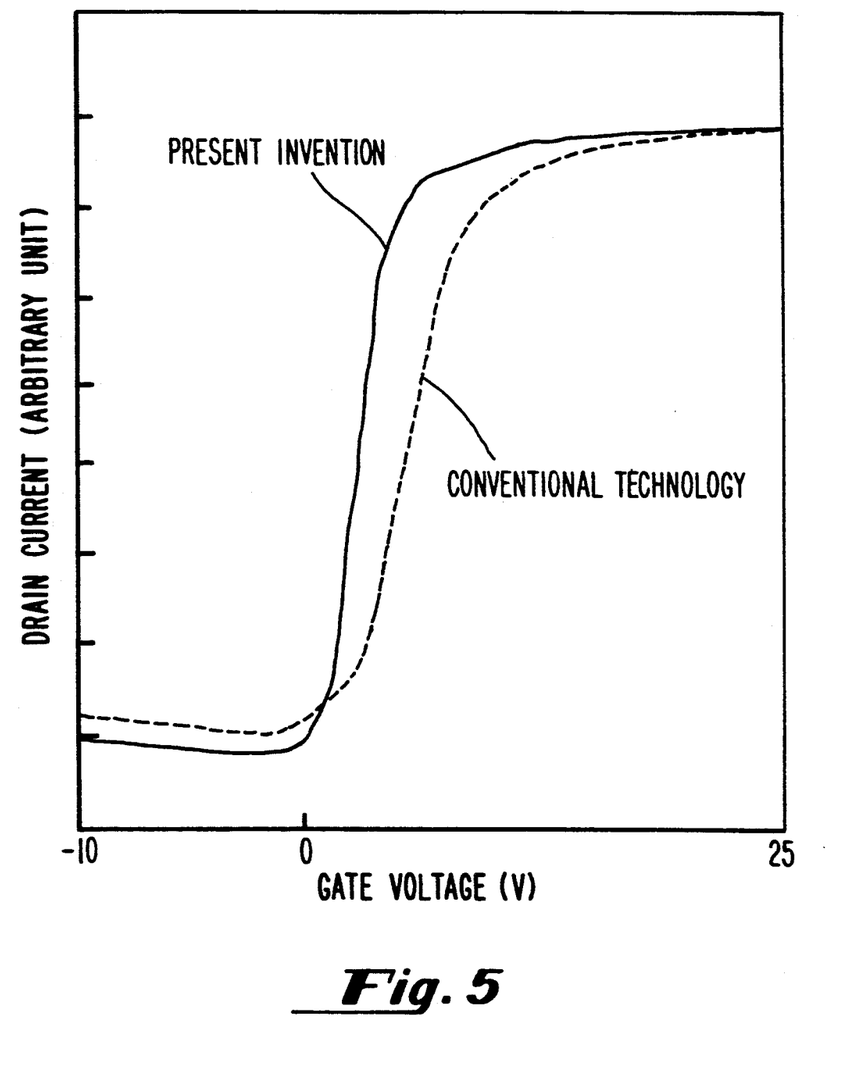
FIG. 5 is a graph showing the variation of drain current as a function of gate voltage of the thin film transistor manufactured according to an embodiment of the invention compared with the conventional example.

FIG. 5 is a graph showing the variation of drain current as a function of gate voltage of the thin film transistor manufactured according to the invention, compared with the conventional example. Also, the dotted line in the figure is a graph showing the gate voltage versus drain current curve of the conventional thin film transistor. As is clear, rise of the drain current by the gate voltage of the thin film transistor is sharp, and the improvement of the characteristics and mobility of the thin film transistor according to the invention is confirmed.

The advantages obtained by the invention is summarized as follows. As is evident from the embodiments, by accelerating, irradiating, and implanting ions produced by decomposition of a hydride gas including a dopant by electric discharge, through, as a mask, either the protecting insulation layer itself or the protection layer with the photoresist layer left thereon, or, in case of the absence of the insulation layer, a photoresist layer which is thicker than the projected range of hydrogen ion, the source and drain regions (i.e. n-type amorphous silicon layer) are formed selectively. This is accomplished without the hydrogen ions penetrating to the boundary of the gate insulation layer 23 and amorphous silicon thin layer 24. This results in an improvement of mobility and reliability of the thin film transistor. Further, by the use of plasma processing apparatus, for which mass separation and scanning of ion flow is not necessary, doping of the large area is easily carried out, and can provide the thin film transistor high mobility and high integration without defects in the channel region of the semiconductor thin layer.

What is claimed:

1. A method of fabricating a thin film transistor including a channel region and source and drain regions, comprising the steps of:

forming and depositing in order on an insulating substrate, a gate electrode, a gate insulation layer, and a semiconductor thin film of amorphous silicon, and forming the source and drain regions by accelerating and implanting ions, produced by discharge-decomposition of a doping hydride gas and a diluting gas, into the semiconductor layer on which a protecting insulation layer is formed over the channel region characterized in that the thickness of the protecting insulation layer is larger than a projected range of hydrogen ions in the protecting insulation layer.

2. A method of fabricating a thin film transistor according to claim 1, characterized in that the protecting insulation layer comprises an insulator layer.

3. A method of fabricating a thin film transistor according to claim 1, characterized in that the protecting insulation layer comprises a photoresist layer.

4. A method of fabricating a thin film transistor according to claim 1, characterized in that the protecting insulation layer comprises a deposited layer of an insulator layer and photoresist layer.

5. A method of fabricating a thin film transistor according to claim 1, characterized in that the diluting gas comprises hydrogen or helium.

* * * * *